(12) United States Patent
Bai

(10) Patent No.: US 9,166,840 B2
(45) Date of Patent: Oct. 20, 2015

(54) METHOD OF TRANSMITTING DATA SAMPLES WITH REDUCED BANDWIDTH

(71) Applicant: Telefonaktiebolaget L M Ericsson (PUBL), Stockholm (SE)

(72) Inventor: Chunlong Bai, Kanata (CA)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 14/282,032

(22) Filed: May 20, 2014

(65) Prior Publication Data

US 2014/0254656 A1 Sep. 11, 2014

Related U.S. Application Data

(62) Division of application No. 13/553,014, filed on Jul. 19, 2012, now Pat. No. 8,761,241.

(60) Provisional application No. 61/611,355, filed on Mar. 15, 2012.

(51) Int. Cl.
| | |
|---|---|
| H04L 25/08 | (2006.01) |
| H03M 7/30 | (2006.01) |
| H03F 1/32 | (2006.01) |
| H04L 29/06 | (2006.01) |
| H03F 3/195 | (2006.01) |
| H03F 3/24 | (2006.01) |
| H04N 19/63 | (2014.01) |
| H04L 25/03 | (2006.01) |
| H04L 27/36 | (2006.01) |

(52) U.S. Cl.
CPC .............. *H04L 25/08* (2013.01); *H03F 1/3247* (2013.01); *H03F 3/195* (2013.01); *H03F 3/245* (2013.01); *H03M 7/30* (2013.01); *H04L 69/04* (2013.01); *H04N 19/63* (2014.11); *H03F 2201/3227* (2013.01); *H04L 25/03343* (2013.01); *H04L 27/367* (2013.01)

(58) Field of Classification Search
USPC ............ 375/316, 240, 295, 219, 220, 240.01, 375/240.11, 240.21, 240.25, 240.26
See application file for complete search history.

(56) References Cited

U.S. PATENT DOCUMENTS

| | | | |
|---|---|---|---|
| 4,692,806 | A | 9/1987 | Anderson et al. |
| 5,978,518 | A * | 11/1999 | Oliyide et al. ................. 382/260 |
| 2005/0143973 | A1* | 6/2005 | Taniguchi et al. ......... 704/200.1 |
| 2012/0328050 | A1 | 12/2012 | Bai et al. |
| 2013/0176153 | A1 | 7/2013 | Rachid et al. |

FOREIGN PATENT DOCUMENTS

| | | | |
|---|---|---|---|
| EP | 1111589 | A1 | 6/2001 |
| EP | 1408615 | A2 | 4/2004 |

* cited by examiner

*Primary Examiner* — Siu Lee
(74) *Attorney, Agent, or Firm* — Coats and Bennett, PLLC

(57) ABSTRACT

Methods and apparatus are disclosed for compressing and decompressing data to reduce bandwidth requirements in transmissions of predistorted signals between a processing node and a remote transmitting node of a power amplifier with digital predistortion (PA-DPD) system. In the processing node, predistorted signals are decomposed into a high-dynamic range signal of a first sample rate and a low-dynamic range signal of a second sample rate greater than the first sample rate. Samples of both signals are combined to generate a compressed signal for transmission to the remote transmitting node, which decompresses the compressed signal to restore the predistorted signal.

8 Claims, 11 Drawing Sheets

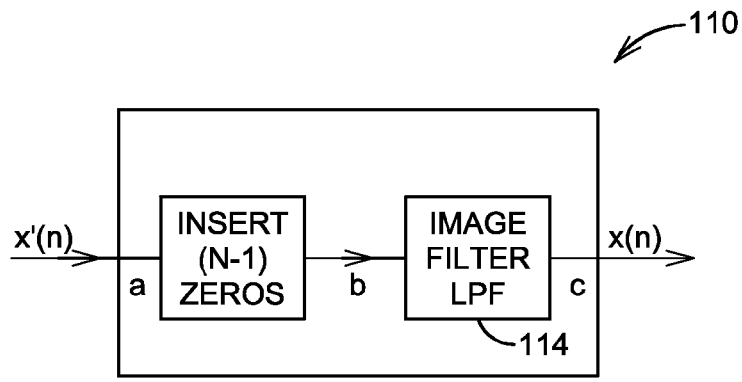
FIG. 2
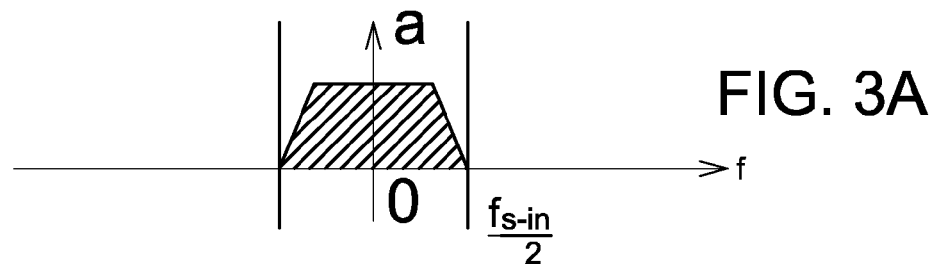
FIG. 3A
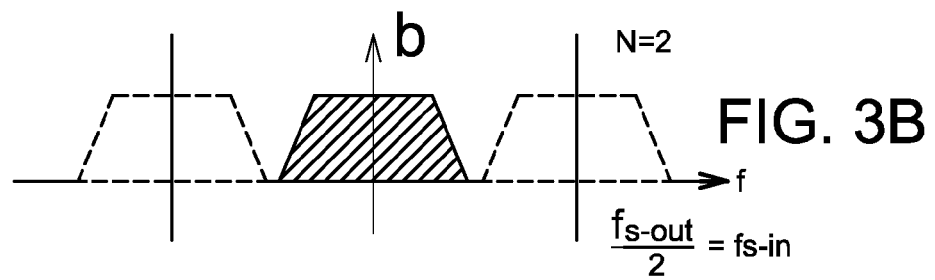
FIG. 3B
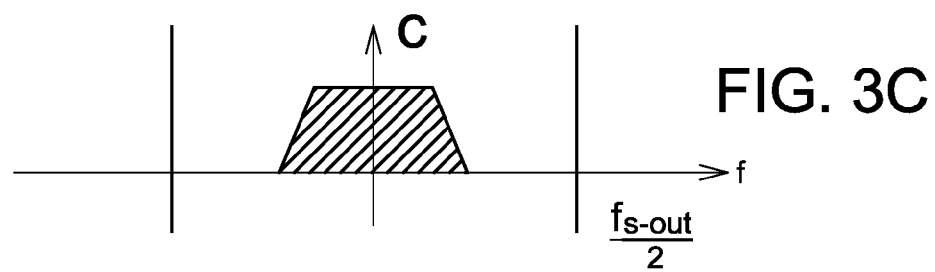
FIG. 3C
FIG. 3

METHOD OF TRANSMITTING DATA SAMPLES WITH REDUCED BANDWIDTH

RELATED APPLICATION

This application is a divisional of U.S. patent application Ser. No. 13/553,014, filed Jul. 19, 2012, which claims priority to U.S. Provisional Patent Application Ser. No. 61/611,355 filed Mar. 15, 2012, and which is incorporated herein by reference in its entirety.

TECHNICAL FIELD

The present invention relates generally to the transmission of predistorted signals between a processing node in a wireless communication network and a transmitting node and, more particularly, to compression of the predistorted signal for transmission between the processing node and the transmitting node.

BACKGROUND

An electronic device often introduces distortion to the signals it processes. A predistorter circuit can be implemented to pre-process the signals before the signals are fed into the electronic device to compensate for the distortion introduced when the signals pass through the device. One example of such an electronic device is a radio-frequency power amplifier. An ideal power amplifier would be efficient and would have a linear response at all frequency ranges. However, a typical power amplifier is most efficient when operated at or near the saturation point, at which point the power amplifier exhibits non-linearities and memory effects. The design of a power amplifier involves a trade-off between linearity and efficiency. One way to improve a power amplifier's efficiency and its overall linearity is to digitally predistort the input to the power amplifier to compensate for the distortion introduced by the power amplifier.

In predistortion, the input signal is adjusted in anticipation of the distortion to be introduced by the device, so that the output signal from the device is largely free of distortions. Predistortion can be quite beneficial in improving the overall performance of a device. Predistorters are usually digitally implemented, in which case the power amplifier system is referred to as a power amplifier with digital predistortion (PA-DPD) system.

In a PA-DPD system, the predistorter can be located remotely from the power amplifier in a centralized processing node. For example, a central processing node may perform predistortion for radio transmitters at multiple remote locations. Such a design reduces power consumption at the remote locations, takes up less space, and offers deployment flexibility. However, when the centralized predistorter is separate from the power amplifiers, transmitting predistorted signals between these two sub-systems requires a relatively large bandwidth due to bandwidth expansion of the predistorted signal.

Accordingly, there remains a need to reduce bandwidth required for transmitting predistorted data from a centralized processing node where the pre-distorted signal is generated to a transmitting node where the pre-distorted signal is amplified and transmitted.

SUMMARY

Exemplary embodiments of the present invention provide methods and apparatus for compressing a predistorted signal for transmission from a processing node to a transmitting node and for decompressing a compressed predistorted signal by the transmitting node. The data compression and decompression techniques described herein reduce bandwidth requirements for data transmission within a PA-DPD system without loss of information or with little loss of information.

At a processing node, the predistorted signal is first decomposed into high-dynamic range components and low-dynamic range components. From the high-dynamic range components, a high-dynamic range signal having a first sample rate is generated. From the low-dynamic range components, a low-dynamic range signal having a second sample rate is generated. The second symbol rate is greater than the first sample rate. A compressed signal is produced by combining samples of the high-dynamic range signal and corresponding samples of the low-dynamic range signal. The compressed signal is then transmitted to a transmitting node.

A data compression circuit implemented in the processing node comprises a decomposition circuit and a combining circuit. The decomposition circuit is configured to decompose the predistorted signal into high-dynamic range components and low-dynamic range components. The decomposition circuit is also configured to generate a high-dynamic range signal and a low-dynamic range signal. The high-dynamic range signal has a first sample rate and contains the high-dynamic range components. The low-dynamic range signal has a second sample rate higher than the first sample rate and contains the low-dynamic range components. The combing circuit is configured to combine samples of the high with corresponding samples of the low-dynamic range signals to produce a compressed signal for transmission to the transmitting node.

On the side of the transmitting node, when a compressed predistorted signal is received from the processing node, the compressed predistorted signal is decompressed by a decompressor. The compressed predistorted signal includes a high-dynamic range signal having a first sample rate, and a low-dynamic range signal having a second sample rate that is greater than the first sample rate. The method of decompressing the compressed predistorted signal comprises matching the sample rate of the high-dynamic range signal with the sample rate of the low-dynamic range signal, and combining the samples of the high-dynamic range signal with corresponding samples of the low-dynamic range signal to obtain a decompressed predistorted signal.

To perform the method of decompressing, the decompressor in the remote node comprises a de-multiplexer, a rate matching circuit, and a combining circuit. The de-multiplexer receives the compressed predistorted signal which includes a high-dynamic range signal having a first sample rate and a low-dynamic range signal having a second sample rate greater than the first sample rate. The de-multiplexer splits the compressed signal into the high-dynamic range signal and the low-dynamic range signal. The rate matching circuit matches the first sample rate of the high-dynamic range signal with the second sample rate of the low-dynamic range signal. The combining circuit combines samples of the dynamic range signal with corresponding samples of the low-dynamic range signal to obtain a decompressed predistorted signal.

By implementing data compression in the processing node and data decompression in the remote transmitting node, less bandwidth is required to transmit the predistorted signal.

BRIEF DESCRIPTION OF FIGURES

FIG. 2 illustrates an exemplary interpolator for the digital predistortion system.

FIG. 3 illustrates transformations of an input signal as it passes through an interpolator.

DETAILED DESCRIPTION

Figure 1:
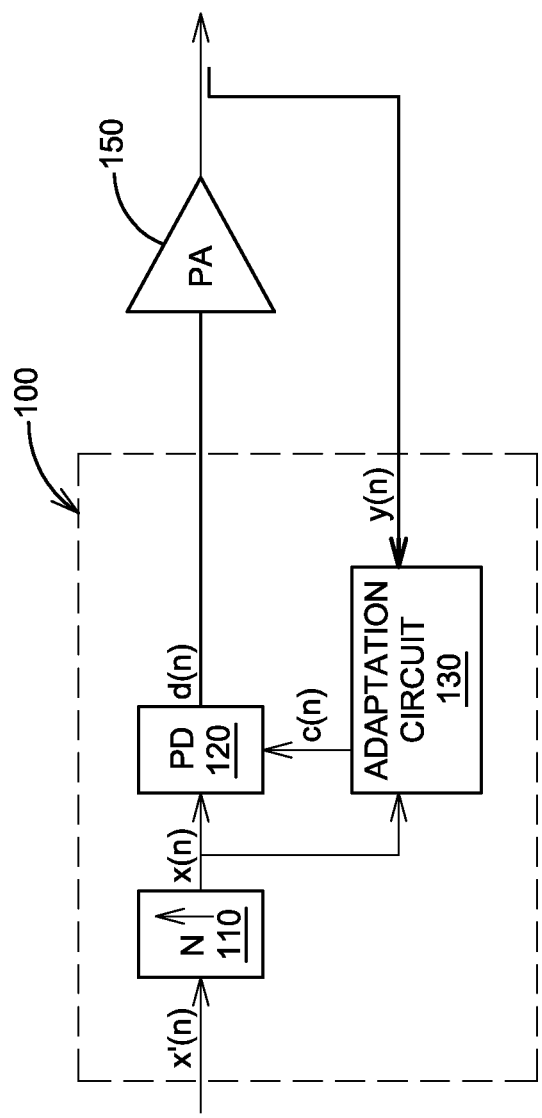
FIG. 1 illustrates an exemplary digital predistortion system for a power amplifier.

Referring now to the drawings, FIG. 1 illustrates in simplified form a digital predistortion system 100 to compensate for distortion introduced into a transmitted signal by a power amplifier 150. The power amplifier 150 is typically most efficient when it is operated in a non-linear range. However, the non-linear response of the power amplifier 150 causes unwanted out-of-band emissions and reduces the spectral efficiency of a communication system.

The digital predistortion system 100 may be used to improve the efficiency and linearity of the power amplifier 150 by "predistorting" the power amplifier's input signal to compensate for non-linear distortion introduced by the power amplifier 150. The digital predistortion system 100 includes an interpolator 110, predistorter 120, and adaptation circuit 130. The digital predistortion system 100 may be implemented in one or more processors, hardware, firmware, or a combination thereof.

An input signal x'(n) is input to the interpolator 110. The interpolator 110 up-samples the input signal x'(n) to increase the sample rate. The up-sampled input signal x(n) is input into the predistorter 120. The predistorter 120 predistorts the input signal x(n) to produce a predistorted signal d(n) for input to the power amplifier 150. After digital-to-analog conversion and filtering, the power amplifier 150 amplifies the predistorted signal to produce an output signal. If the predistorter 120 is properly designed and configured, then the output signal will contain fewer distortion products and out-of-band emissions than if the power amplifier 150 were used alone.

The predistorted signal x(n) is input to the power amplifier 150 and a scaled version of the amplifier output signal y(n) is applied to the adaptation circuit 130. The purpose of the adaptation circuit 130 is to adapt the coefficients c(n), or "parameters," of the predistorter 120 to minimize distortion in the amplifier output signal. The adaptation circuit 130 computes the coefficients c(n) used by the predistorter 120 to predistort the input signal.

The predistorted signal d(n) output by the predistorter 120 will have a bandwidth typically three to five times greater than the bandwidth of the original input signal x'(n). In order to accurately represent the predistorted signal x'(n), the sampling rate needs to meet the Nyquist criteria. That is, the sampling rate of the input signal x'(n) needs to be increased to two times the highest frequency component in the predistorted signal d(n).

FIG. 2 illustrates an exemplary embodiment of the interpolator 110, which up-samples the signal x'(n) to increase the sample rate. The interpolator 110 comprises an up-sampler 112 and a filter 114. The up-sampler 112 inserts N−1 zeroes between consecutive samples in the input signal x'(n) to generate a signal that is N times the received signal. The N−1 zeros inserted into the input signal x'(n) in the time domain create N−1 images of the input signal x'(n) in the frequency domain. The filter 114 filters in the up-sampled input signal x'(n) to remove the unwanted out-of-band components.

FIG. 3 illustrates the transformations of the input signal x'(n) in the frequency domain as it passes through the interpolator 150. FIG. 3A shows the input signal x'(n) at the sample rate $f_{s\text{-}in}$. FIG. 3B shows images of the up-sampled signal x'(n) created by inserting N−1 zeroes into signal x'(n). FIG. 3C shows the signal x(n) output by the interpolator after filtering. The signal x(n) has a sample rate that is N times of the received signal x'(n).

Figure 4:
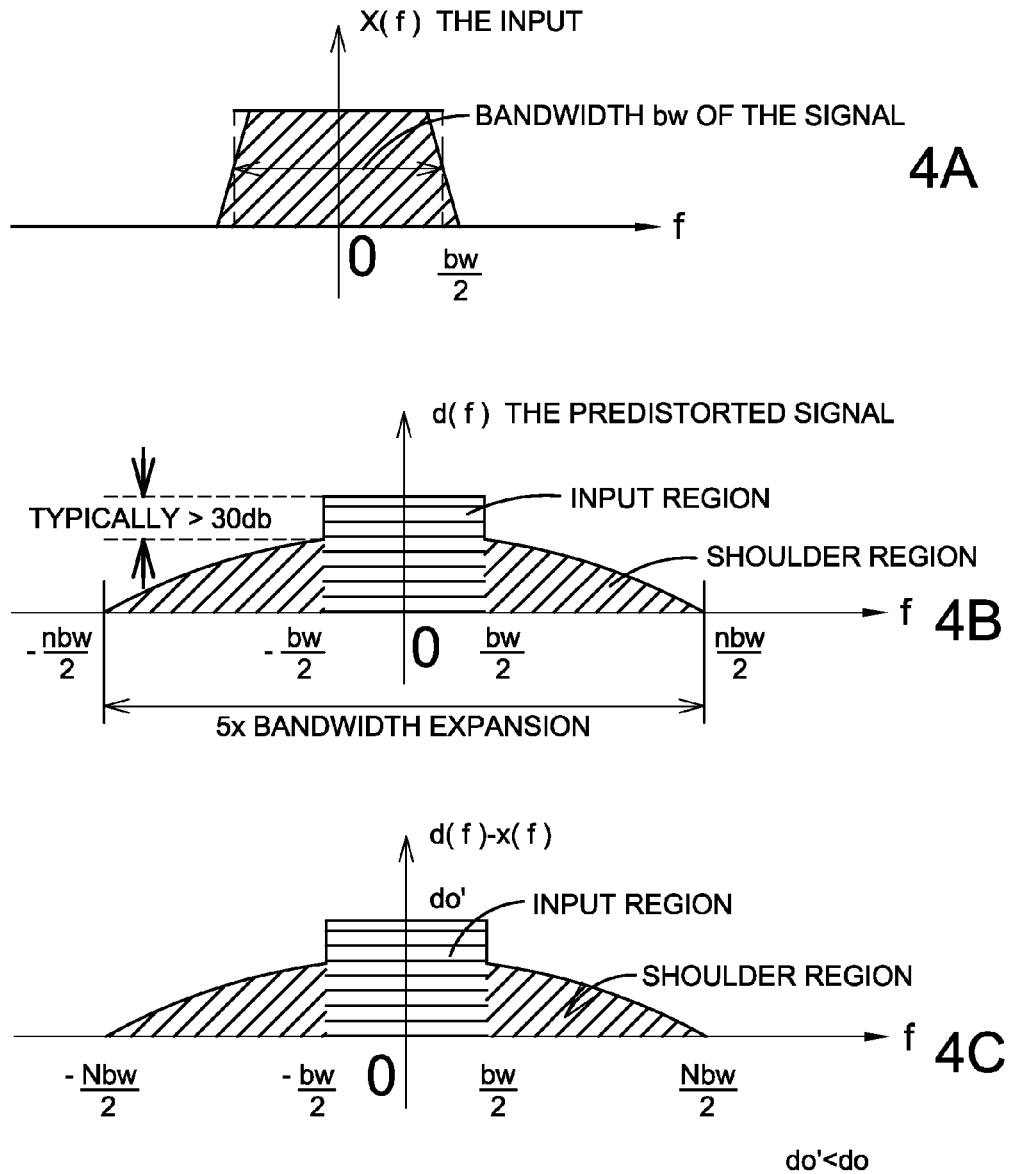
FIG. 4 illustrates the expansion of bandwidth as a result of digital predistortion.

FIG. 4 illustrates the bandwidth expansion effect of the predistorter 120. FIG. 4A illustrates the input signal x(n) in the frequency domain, denoted as x(f). The input signal x(f) has a bandwidth bw. FIG. 4B illustrates the predistorted signal d(f), which is shown having a bandwidth of 5*bw (N=5). FIG. 4C illustrates the predistortion introduced by the predistorter 120, which is obtained by subtracting the input signal x(f) from the predistorted signal d(f).

The predistorted signal d(f) shown in FIG. 4B can be divided into two frequency regions, an "input region" and a "shoulder region." The input region (horizontally shaded) comprises the frequency components in the range bw/2 to −bw/2. The shoulder region (vertically shaded) comprises the frequency components greater than bw/2 and less than −bw/2. The power level of the frequency components in the input region is typically 30 db higher than the power level of the signal in the shoulder region. The frequency components in the input region are referred to herein as the "high-dynamic range" components, while the frequency components in the shoulder region are referred to herein as the "low-dynamic range" components.

Figure 5:
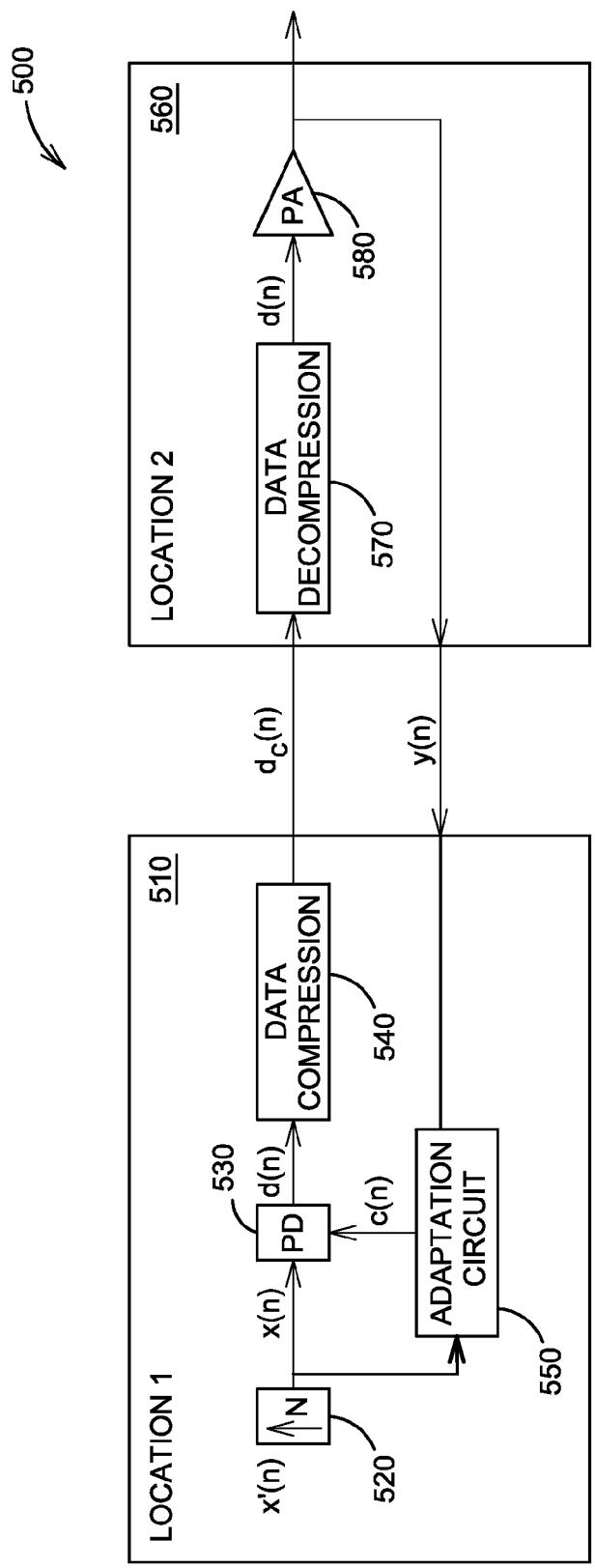
FIG. 5 illustrates an exemplary PA-DPD system with two remotely located nodes.

FIG. 5 illustrates in simplified form a wireless communication system 500 including a predistortion subsystem 510 located remotely from a power amplification subsystem 560. As shown in FIG. 5, the power amplification subsystem 560 (i.e. "transmitting node") may be remote from the predistortion subsystem 510. The predistortion subsystem 510 includes an up-sampler 520, a digital predistorter 530, a data compressor 540, and an adaptation circuit 550. The up-sampler 520, digital predistorter 530 and adaptation circuit 550 operate as previously described. The data compressor 540 compresses the predistorted signal output by the digital predistorter 530 to reduce the bandwidth required to transmit the predistorted signal to the power amplification subsystem 560. The compressed signal $d_c(n)$ output by the data compressor 540 is transmitted to the power amplification subsystem 560.

The power amplification subsystem 560 includes a data decompressor 570 and a power amplifier 580. The data decompressor 570 receives the compressed signal $d_c(n)$ from the digital predistortion subsystem 510, and decompresses the compressed signal to obtain the predistorted signal d(n). After digital-to-analog conversion and filtering, the predistorted signal d(n) is applied to the input of the power amplifier 580. The power amplifier 580 amplifies the predistorted signal d(n) as previously described to produce an output signal. An attenuated version y(n) of the output signal from the power amplification subsystem 560 is fed back to the adaptation circuit 550 in the predistortion subsystem 510.

Figure 6:
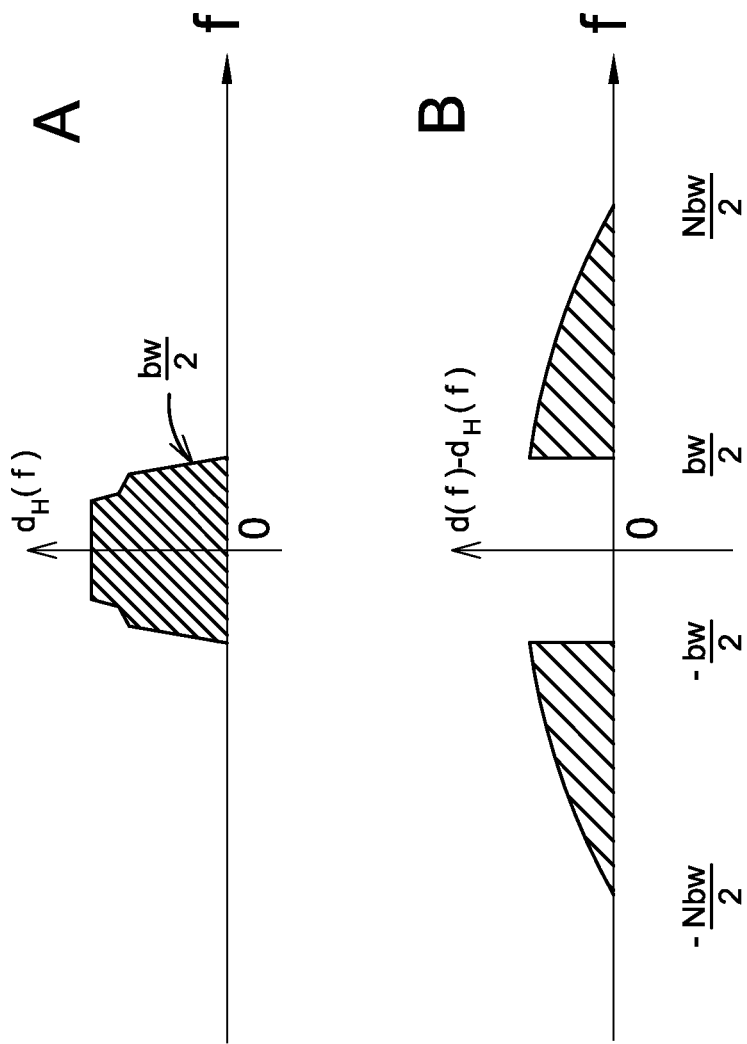
FIG. 6 illustrates a predistorted signal being decomposed into a high-dynamic range component and a low-dynamic range component

In order to compress the predistorted signal d(n), the data compressor 540 decomposes the predistorted signal into high-dynamic range components (shown in FIG. 6A as $d_H(t)$ in the frequency domain) and low-dynamic range components (shown in FIG. 6B as $d(t)-d_H(t)$ in the frequency domain). The high-dynamic range components have a higher dynamic range and require more bits to be represented accurately than the low-dynamic range components. On the other hand, the highest frequency in the high-dynamic range component is lower than the lowest frequency in the low-dynamic range component, so a lower sample rate can be used for the high-dynamic range components. The data compressor 540 takes advantage of these observations by generating a high-dynamic range signal denoted $d_H(n)$ for the high-dynamic range components and a separate low-dynamic range signal denoted $d_L(n)$ for the low-dynamic range components. Due to the lower frequency content, the high-dynamic range signal $d_H(n)$ requires fewer samples to be accurately represented than the low-dynamic range signal $d_L(n)$. However, due to the lower dynamic range, the samples of the low-dynamic range signal $d_L(n)$ require fewer bits. Thus, compression is achieved by both lowering the sample rate of the high-dynamic range signal $d_H(n)$ and reducing the number of bits in each sample of the low-dynamic range signal $d_L(n)$.

Figure 7:
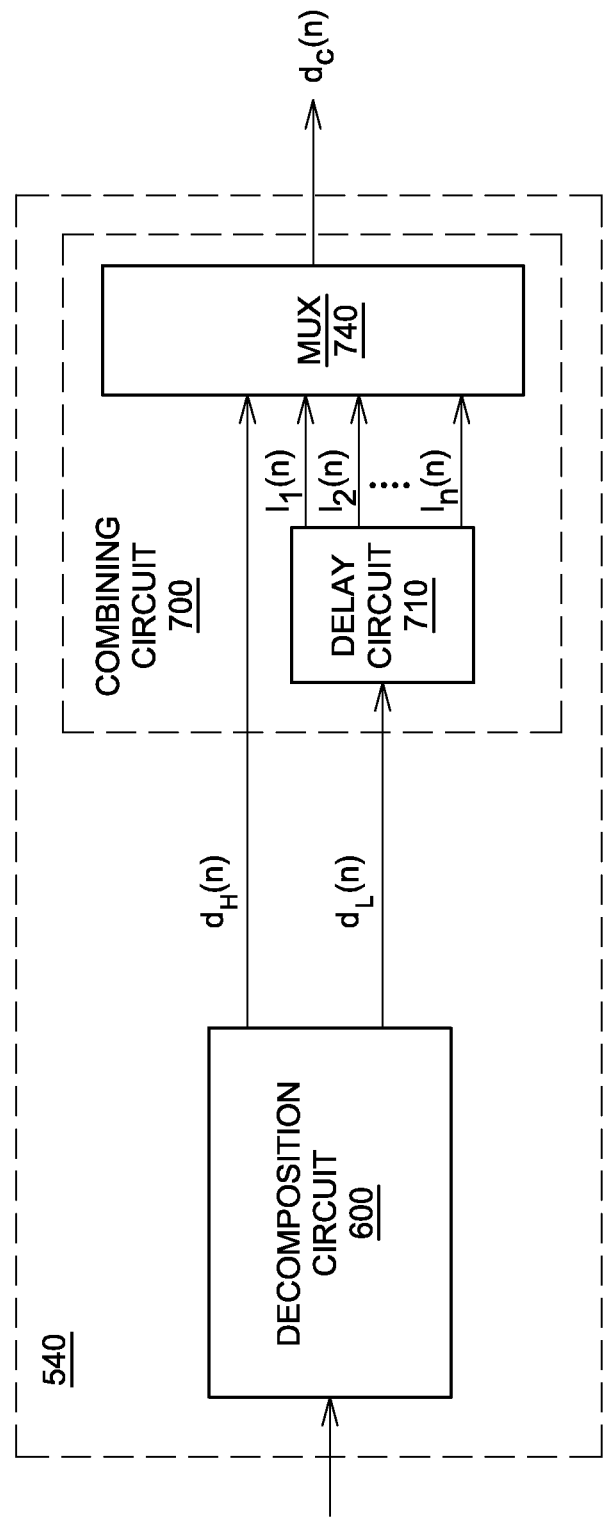
FIG. 7 illustrates an exemplary processing node for compressing a predistorted signal.

FIG. 7 illustrates the main functional components of the data compressor 540. The data compressor 540 includes a decomposition circuit 600 and a combining circuit 700. The decomposition circuit 600 decomposes the input signal into high-dynamic range components and low-dynamic range components, and outputs a high-dynamic range signal $d_H(n)$ and a low-dynamic range signal $d_L(n)$. The high-dynamic range signal $d_H(n)$ has a first sample rate and a first number of bits per sample. The low-dynamic range signal has a second sample rate and a second number of bits per sample. The sample rate of the low-dynamic range signal $d_L(n)$ is higher than the sample rate of the high-dynamic range signal, $d_H(n)$ but uses fewer bits per sample.

The low-dynamic range signal $d_L(n)$ and the high-dynamic range signal $d_H(n)$ are input to the combining circuit 700 for combining prior to transmission. The combining circuit 700 includes a tapped delay circuit 710 and a multiplexer 740. The tapped delay circuit 710 delays samples of the low-dynamic range signal and outputs $l_1(n), l_2(n), \ldots, l_{N_D}(n)$. The delayed samples are input to multiplexer 740 synchronously with corresponding samples of the high-dynamic range signal $d_H(n)$. The multiplexer 740 combines each sample of the high-dynamic range signal $d_H(n)$ with corresponding samples of the low-dynamic range signal $d_L(n)$ to create a compressed signal $d_c(n)$ for transmission to the power amplification subsystem 560.

Figure 8:
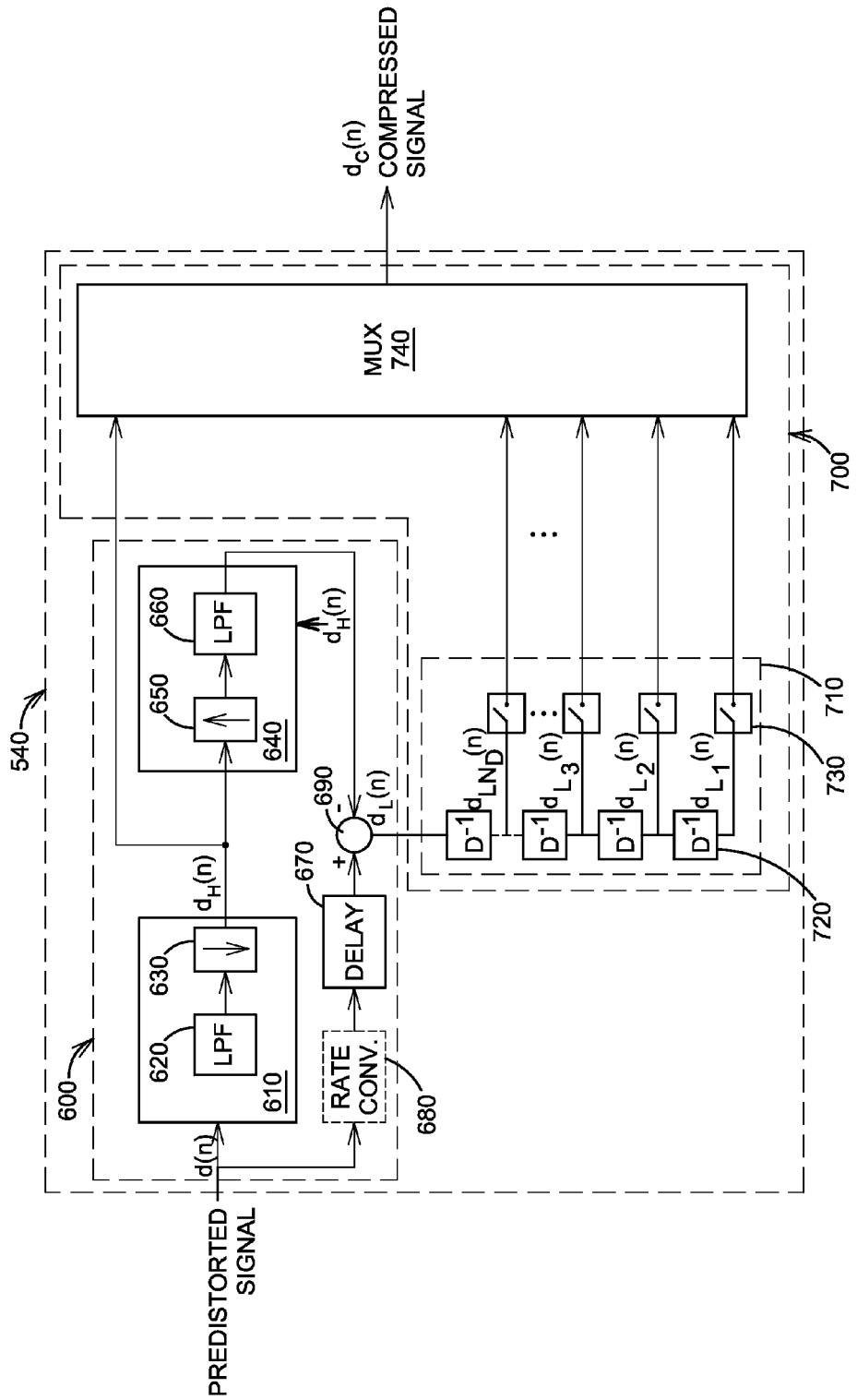
FIG. 8 illustrates an embodiment of the processing node.

FIG. 8 illustrates one embodiment of the data compressor 540 in greater detail. The decomposition circuit 600 comprises a decimator 610 and an interpolator 640 connected in series. The decomposition circuit 600 also includes an optional rate converter 680, a delay circuit 670, and a summer 690. The decimator 610 generates the high-dynamic range signal $d_H(n)$ having a first sample rate. The high-dynamic range signal $d_H(n)$ is then up-sampled by the interpolator 640 and subtracted from the predistorted signal by the summer 690 to generate the low-dynamic range signal $d_L(n)$. The delay circuit 670 delays the samples of the predistorted signal d(n) to match the processing delay of the decimator 610 and interpolator 640. The optional rate converter 680 may be used where the sample rate of the predistorted signal d(n) is different from the sample rate of the low-dynamic range signal $d_L(n)$.

The decimator 610 includes a low pass filter 620 and down-sampler 630. The low pass filter 620 filters the predistorted signal to remove the frequency components in the "shoulder region" to generate a high-dynamic range signal, $d_H(n)$. However, the sample rate of the signal output from the low pass filter 620 is higher than need to accurately represent the high-dynamic range signal $d_H(n)$. The down-sampler 630 reduces the sample rate to the desired sample rate, which is close to the Nyquist rate of the high-dynamic range signal $d_H(n)$.

Because the high-dynamic range signal $d_H(n)$ has been down-sampled by the decimator 610, $d_H(n)$ is up-sampled by the interpolator 640 to restore the high-dynamic range signal $d_H(n)$ to the sample rate of the low-dynamic range signal $d_L(n)$ before being subtracted from the input signal d(n). The interpolator 640 comprises an up-sampler 650 and low pass filter 660. The up-sampler 650 up-samples the high-dynamic range signal output by the decimator 610 and the low pass filter 660 removes unwanted out-of band components. The up-sampled high-dynamic range signal, denoted as $d_H^\uparrow(n)$, is output to the summer 690. In some implementations, the interpolator 640 may be configured to up-sample the high-dynamic range signal $d_H(n)$ to a sample rate different from that of the input signal, in which case the rate converter 680 is needed to match the sample rate of the input signal to the desired sample rate of low-dynamic range signal $d_L(n)$ before subtraction of the up-sampled high-dynamic range signal $d_H^\uparrow(n)$.

The summer 690 subtracts the up-sampled high-dynamic range signal $d_H^\uparrow(n)$ from the predistorted signal d(n) to obtain the low-dynamic range signal $d_L(n)$, as shown in FIG. 8. The delay circuit 670 delays the predistorted signal d(n) to account for the processing delay of the decimator 610 and the interpolator 640. The delay operation synchronizes the input signal and the up-sampled high-dynamic range signal $d_H^\uparrow(n)$ before subtracting the latter from the former to obtain the low-dynamic range signal $d_L(n)$. The low-dynamic range signal $d_L(n)$ is then input into the combining circuit 700.

The combining circuit 700 includes a tapped delay circuit 710 and a multiplexer 740. The high-dynamic range signal $d_H(n)$ is input directly into the multiplexer 740. The low-dynamic range signal $d_L(n)$ is input to the tapped delay circuit 710. The tapped delay circuit 710 receives samples of the low-dynamic range signal $d_L(n)$ output by the summer 690. The tapped delay circuit 710 comprises a plurality of delay registers 720 forming a tapped delay line. The number of delay registers 720, $N_L$, corresponds to the sample rate of the low-dynamic range signal $d_L(n)$. The samples of the low-dynamic range signal $d_L(n)$ are shifted one at a time into the tapped delay line. Each delay register 720 adds a delay to the sample as it passes through the tapped delay line 720. The contents of the delay registers 720 are retrieved synchronously through a set of synchronized switches 730.

In the most generic terms, the content of each delay register can be mathematically expressed as follows:

$$d_{L_1}(n) = d\left(n\frac{N}{N'}T_{s-in} - \left(\frac{N-1}{N'}\right)T_{s-in}\right) - d_H^\uparrow\left(n\frac{N}{N'}T_{s-in} - \left(\frac{N-1}{N'}\right)T_{s-in}\right);$$

$$d_{L_2}(n) = d\left(n\frac{N}{N'}T_{s-in} - \left(\frac{N-2}{N'}\right)T_{s-in}\right) - d_H^\uparrow\left(n\frac{N}{N'}T_{s-in} - \left(\frac{N-2}{N'}\right)T_{s-in}\right);$$

$$d_{L_3}(n) = d\left(n\frac{N}{N'}T_{s-in} - \left(\frac{N-3}{N'}\right)T_{s-in}\right) - d_H^\uparrow\left(n\frac{N}{N'}T_{s-in} - \left(\frac{N-3}{N'}\right)T_{s-in}\right);$$

$$\ldots$$

$$d_{L_{N_D}}(n) = d\left(n\frac{N}{N'}T_{s-in} - \left(\frac{1}{N}\right)T_{s-in}\right) - d_H^\uparrow\left(n\frac{N}{N'}T_{s-in} - \left(\frac{1}{N'}\right)T_{s-in}\right).$$

Here $l_1(n), l_2(n), \ldots, l_{N_D}(n)$ denote the samples of the low-dynamic range signal $d_L(n)$ and are expressed as the difference between the signal $d(n)$ and $d_H(n)$ at every sampling time interval, $(N/N')T_{s-in}$, where $(N'/N)(1/T_{s-in})$ is the sample rate of $d_H^\uparrow(n)$ and $(1/T_{s-in})$ is the sample rate of $d(n)$.

The multiplexer 740 combines samples of the low-dynamic range signal $d_L(n)$ with corresponding samples of the high-dynamic range signal $d_H(n)$ to produce a compressed signal $d_c(n)$. The multiplexer 740 operates at the sample rate of the high-dynamic range signal $d_H(n)$. Each time a sample of the high-dynamic range signal $d_H(n)$ is input to the multiplexer 740, corresponding samples of the low-dynamic range signal $d_L(n)$ are output via switches 730 to the multiplexer 740. The multiplexer 740 combines the sample of the high-dynamic range signal $d_H(n)$ with the corresponding samples of the low-dynamic range signal $d_L(n)$ to generate a compressed predistorted signal $d_c(n)$, which the data compressor 540 outputs to the power amplification subsystem 570.

Figure 9:
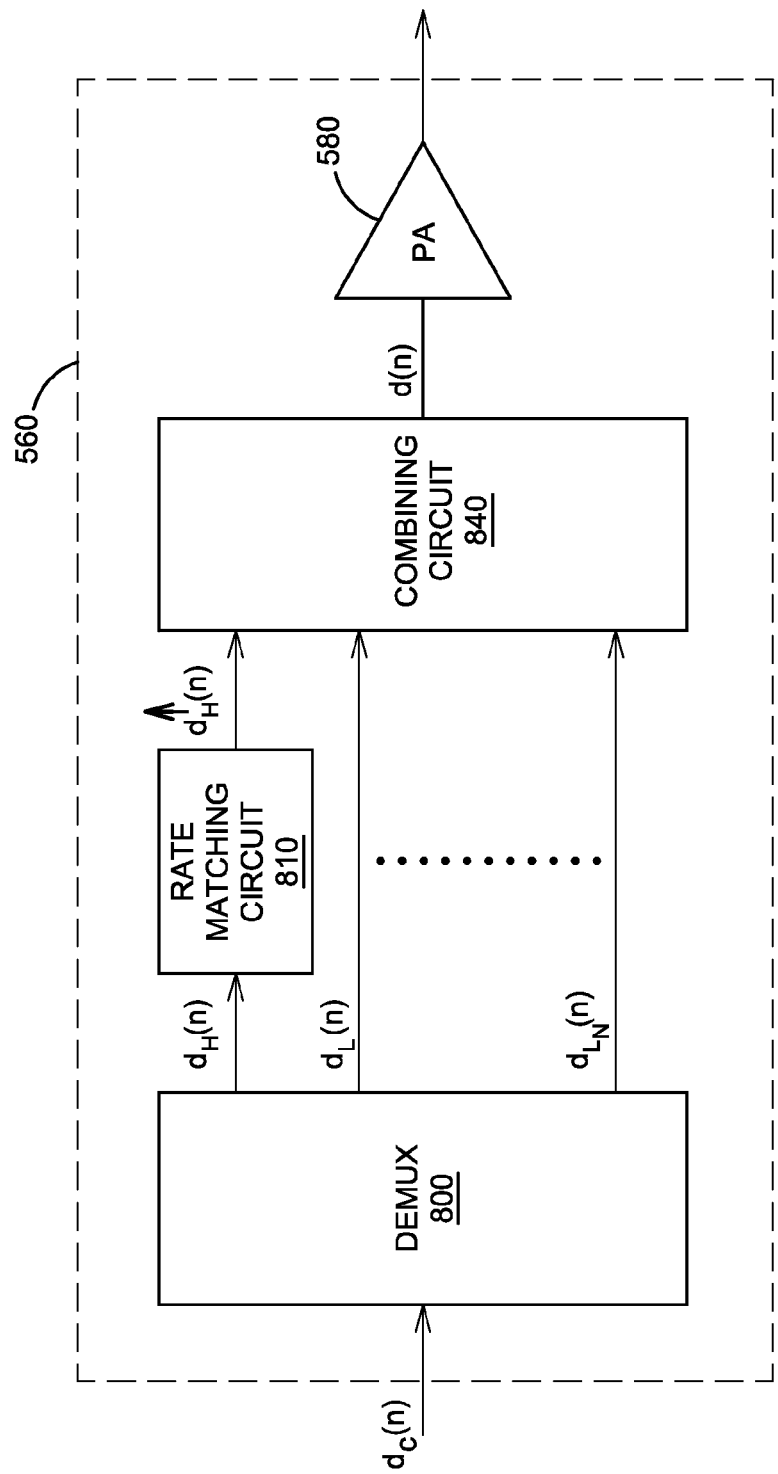
FIG. 9 illustrates an exemplary remote node for decompressing a compressed predistorted signal.

FIG. 9 illustrates of the main functional components of the power amplification subsystem 560. The power amplification subsystem 560 includes a demultiplexer 800, a rate matching circuit 810, a combining circuit 840, an analog power amplifier 580. The demultiplexer 800 receives the compressed predistorted signal $d_c(n)$ as input and demultiplexes the compressed signal back into a high-dynamic range signal $d_H(n)$ and the low-dynamic range signal $d_L(n)$. Depending on the implementation of the multiplexer 740 in the data compressor 540, the high-dynamic range signal $d_H(n)$ from the de-multiplexer 800 may have a different sample rate than that of the predistorted signal $d(n)$. The rate matching circuit 810 up-samples the high-dynamic range signal $d_H(n)$ to the sample rate of the low-dynamic range signal $d_L(n)$. The up-sampled high-dynamic range signal $d_H^\uparrow(n)$ is then combined with the low-dynamic range signal $d_L(n)$ in the combining circuit 840 to obtain the predistorted signal $d(n)$, which after digital-to-analog conversion and filtering is input to the power amplifier 580.

The data decompressor 570 illustrated in the block diagram of FIG. 8 may be realized in different implementations by a person skilled in the art. A specific embodiment of the data decompressor 570 is presented in FIG. 10 as an example.

Figure 10:
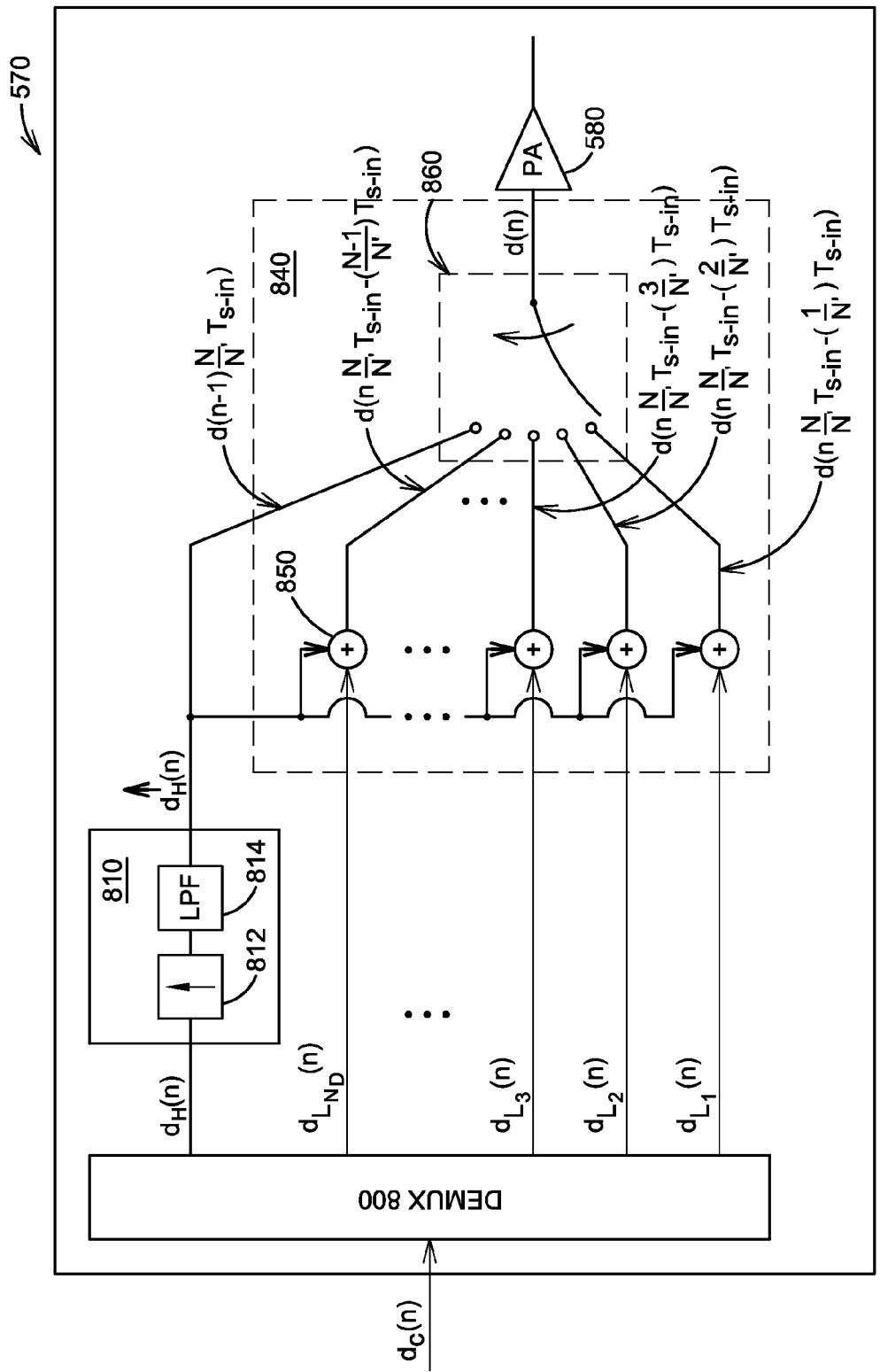
FIG. 10 illustrates an embodiment of the remote node.

Referring to FIG. 10, the demultiplexer 800 outputs samples of the high-dynamic range signal $d_H(n)$ and the low-dynamic range signal $d_{L_i}(n)$ at a first sample rate equal to the sample rate of the high-dynamic range signal $d_H(n)$. The samples of high-dynamic range signal are output to the rate matching circuit 810, while the samples of the low-dynamic range signal $d_{L_i}(n)$ are output to the combining circuit 840. Because the sample rate of the high-dynamic range signal $d_H(n)$ is lower than that of the predistorted signal $d(n)$, the rate matching circuit 810 up-converts the high-dynamic range signal $d_H(n)$ to match the sample rate of the low-dynamic range signal. The rate matching circuit 810 may, for example, comprise an interpolator as previously described and shown in FIG. 2. The rate matching circuit 810 includes an up-sampler 812 to up-sample the high-dynamic range signal $d_H(n)$ and a low-pass filter 814 to remove unwanted out-of-band components.

In the combining circuit 840, samples of the up-sampled high-dynamic range signal $d_H^\uparrow(n)$ are summed with corresponding samples of the low-dynamic range signal $d_{L_i}(n)$ to form composite samples. The combining circuit 840 includes a plurality of summers 850 and a selection circuit 860, which operates at the sample rate of the low-dynamic range signal. During each sampling interval, the rate matching circuit 810 outputs one sample of the up-sampled high-dynamic range signal $d_H^\uparrow(n)$ to the combining circuit 840. The summers 850 add the sample output by the rate matching circuit 810 with the samples of the low-dynamic range signal $d_{L_i}(n)$ output by the demultiplexer 800. The selection circuit 860 selects one of the combined samples for output to the power amplifier 580. The output sequence of the composite signals may be denoted as:

$$d\left(n\frac{N}{N'}T_{s-in} - \left(\frac{1}{N}\right)T_{s-in}\right), d\left(n\frac{N}{N'}T_{s-in} - \left(\frac{2}{N}\right)T_{s-in}\right),$$

$$d\left(n\frac{N}{N'}T_{s-in} - \left(\frac{3}{N}\right)T_{s-in}\right) \ldots d\left(n\frac{N}{N'}T_{s-in} - \left(\frac{N-1}{N}\right)T_{s-in}\right),$$

$$d\left((n-1)\frac{N}{N'}T_{s-in}\right) \ldots,$$

with $T_{s-in}$ representing the sampling time interval of the predistorted signal output from the predistorter 530.

Figure 11:
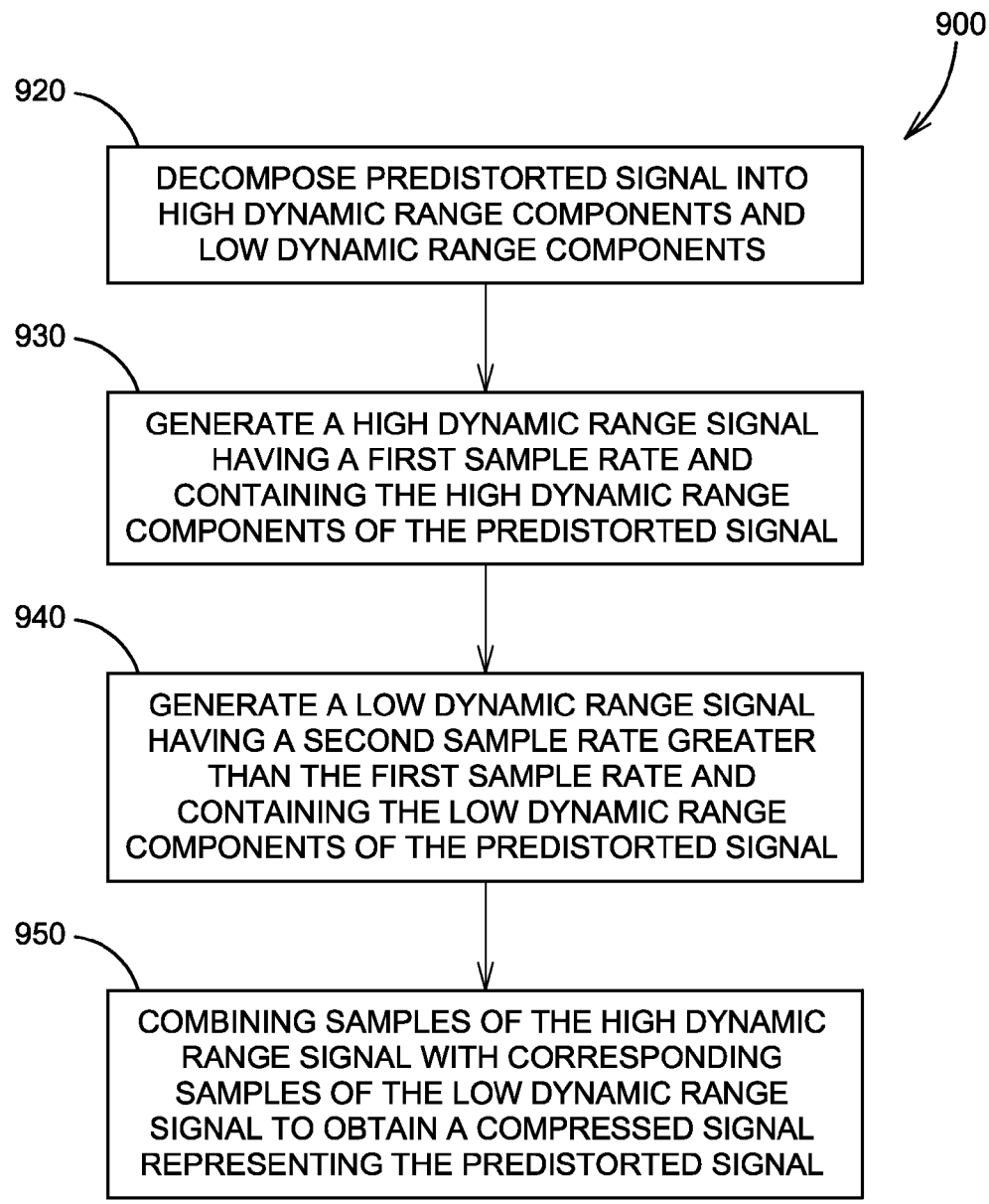
FIG. 11 is a flow chart illustrating an exemplary data compressing process at a processing node.

FIG. 11 is a flow chart illustrating the data compressing process 900 implemented in the data compressor 540. In the data compressing process 900, a predistorted signal is decomposed into high-dynamic range components and low-dynamic range components (Step 920). A high-dynamic range signal $d_H(n)$ having a first sample rate is generated. (Step 930). The high-dynamic range signal $d_H(n)$ contains the high-dynamic range components of the predistorted signal. A low-dynamic range signal $d_L(n)$ having a second sample rate is also generated (Step 940). The low-dynamic range signal $d_L(n)$ contains the low-dynamic range components of the predistorted signal. To obtain a compressed signal representing the predistorted signal, samples of the high-dynamic range signal $d_H(n)$ are combined with corresponding samples of the low-dynamic range signal $d_L(n)$ (Step 950).

Figure 12:
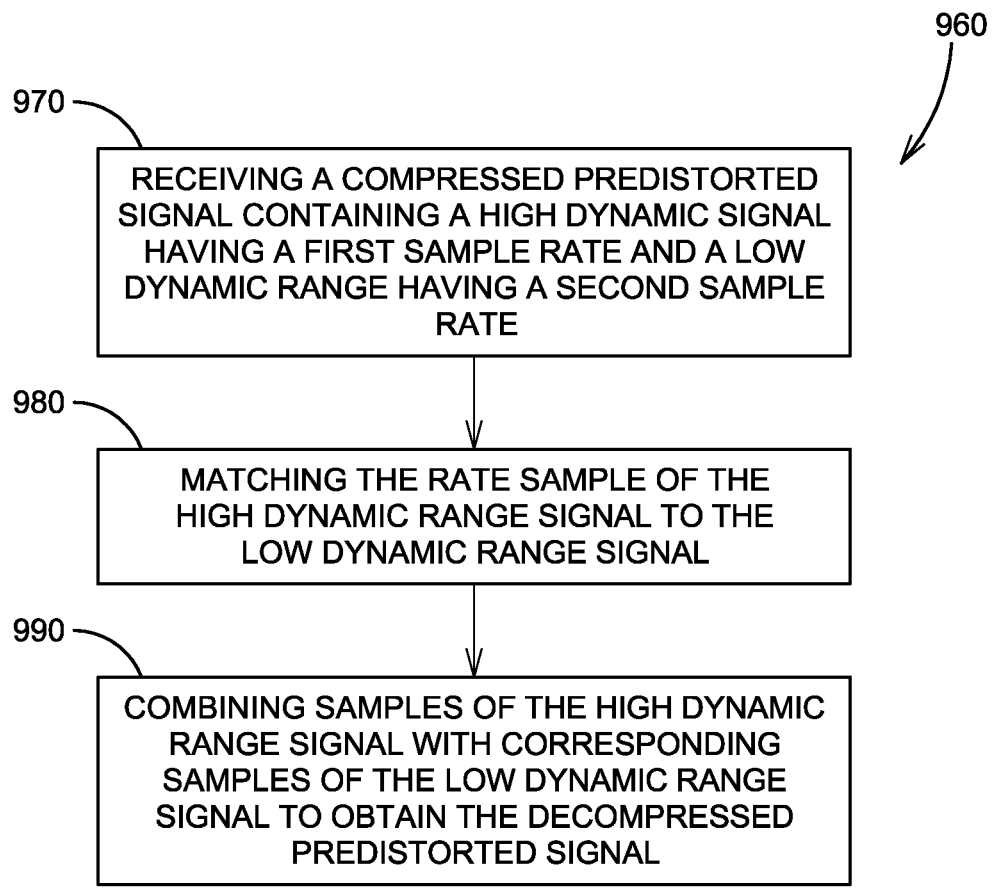
FIG. 12 is a flow chart illustrating an exemplary data decompressing process at a remote node.

FIG. 12 is a flow chart illustrating the data decompressing process 960 implemented in the data decompressor 570. In the data decompressing process 960, a compressed predistorted signal is received (Step 970). The compressed predistorted signal contains a high-dynamic range signal $d_H(n)$ having a first sample rate and a low-dynamic range signal $d_L(n)$ having a second sample rate. The sample rate of the high-dynamic range signal $d_H(n)$ is then converted to match that of the low-dynamic range signal $d_L(n)$ (Step 980). To obtain the decompressed predistorted signal, samples of the high and low-dynamic range signals $d_L(n)$ are combined (Step 990).

The present invention may be carried out in other specific ways than those herein set forth without departing from the scope and essential characteristics of the invention. One or more of the specific processes discussed above may be carried out in a cellular phone or other communications transceiver comprising one or more appropriately configured processing circuits, which may in some embodiments be embodied in one or more application-specific integrated circuits (ASICs). In some embodiments, these processing circuits may comprise one or more microprocessors, microcontrollers, and/or digital signal processors programmed with appropriate software and/or firmware to carry out one or more of the operations described above, or variants thereof. In some embodiments, these processing circuits may comprise customized hardware to carry out one or more of the functions described above. The present embodiments are, therefore, to be considered in all respects as illustrative and not restrictive, and all changes coming within the meaning and equivalency range of the appended claims are intended to be embraced therein.

The invention claimed is:

1. A method for decompressing a compressed predistorted signal received from a processing node, said method comprising:
   receiving a compressed signal including samples of a high-dynamic range signal having a first sample rate and samples of a low-dynamic range signal having a second sample rate;
   matching the sample rate of the high-dynamic range signal with the sample rate of the low-dynamic range signal; and
   combining samples of the high-dynamic range signal with corresponding samples of the low-dynamic range signal to obtain a decompressed predistorted signal.

2. The method of claim 1, wherein matching the sample rate of the high-dynamic range signal with the sample rate of the low-dynamic range signal comprises up-sampling the high-dynamic range signal to match the sample rate of the low-dynamic range signal.

3. The method of claim 2, further comprising filtering the high-dynamic range signal following said up-sampling the high-dynamic range signal to remove out-of-band components.

4. The method of claim 1, wherein combining samples of the high-dynamic range signal with corresponding samples of the low-dynamic range signal comprises:
   summing samples of the high-dynamic range signal with corresponding samples of the low-dynamic range signal to generate composite samples; and
   sequentially outputting the composite samples to generate the decompressed predistorted signal.

5. A decompressor for decompressing a compressed predistorted signal, said decompressor comprising:
   an input to receive a compressed predistorted signal including samples of a high-dynamic range signal having a first sample rate and samples of a low-dynamic range signal having a second sample rate;
   a rate matching circuit to match the first sample rate of the high-dynamic range signal with the second sample rate of the low-dynamic range signal; and
   a combining circuit to combine samples of the high-dynamic range signal with corresponding samples of the low-dynamic range signal to obtain a decompressed predistorted signal.

6. The decompressor of claim 5, wherein the rate matching circuit comprises an interpolator to up-sample the high-dynamic range signal to match the sample rate of the low-dynamic range signal.

7. The decompressor of claim 6, wherein the interpolator includes a filter to remove out-of-band components from the up-sampled high-dynamic range signal.

8. The decompressor of claim 5, wherein the combining circuit comprises:
   a summing circuit to sum samples of the high-dynamic range signal with corresponding samples of the low-dynamic range signal to generate composite samples; and
   a selector to sequentially output the composite samples to generate the decompressed predistorted signal.

* * * * *

UNITED STATES PATENT AND TRADEMARK OFFICE
CERTIFICATE OF CORRECTION

Page 1 of 1

PATENT NO. : 9,166,840 B2
APPLICATION NO. : 14/282032
DATED : October 20, 2015
INVENTOR(S) : Chunlong Bai It is certified that error appears in the above-identified patent and that said Letters Patent is hereby corrected as shown below:

On the title page

Item (62), under "Related U.S. Application Data", delete "Division of application No. 13/553,014, filed on Jul. 19, 2012, now Pat. 8,761,241." and insert -- Division of application No. 13/553,014, filed on Jul. 19, 2012, now Pat. 8,761,241 claiming benefit of Provisional application No. 61/611,335, filed on March 15, 2012. --, therefore.

In the specification

In Column 1, line 6, under "RELATED APPLICATION", delete "61/611,355" and insert -- 61/611/335 --, therefore.

Signed and Sealed this
Twenty-second Day of March, 2016

Michelle K. Lee
*Director of the United States Patent and Trademark Office*